United States Patent
Furuta

[11] Patent Number: 6,153,887
[45] Date of Patent: Nov. 28, 2000

[54] SUCKED MATERIAL DETECTOR, SUCKED MATERIAL DETECTING METHOD USING THE SAME DETECTOR, SHIFT DETECTING METHOD USING THE SAME DETECTOR, AND CLEANING METHOD USING THE SAME DETECTOR

[75] Inventor: Katsunobu Furuta, Tokyo, Japan

[73] Assignee: Advantest Corporation, Tokyo, Japan

[21] Appl. No.: 09/147,304

[22] PCT Filed: May 28, 1997

[86] PCT No.: PCT/JP97/01810

§ 371 Date: Nov. 24, 1998

§ 102(e) Date: Nov. 24, 1998

[87] PCT Pub. No.: WO97/46071

PCT Pub. Date: Apr. 12, 1997

[30] Foreign Application Priority Data

May 31, 1996 [JP] Japan .................................. 8-138778
May 23, 1997 [JP] Japan .................................. 9-133724

[51] Int. Cl.[7] ............................ G01N 21/86; B66C 1/00; B23Q 17/22
[52] U.S. Cl. ................................. 250/559.4; 250/222.1; 356/375; 414/737; 29/407
[58] Field of Search ................... 250/559.4, 222.1; 271/265.01; 294/64.1, 907; 414/737, 752, 800; 901/40; 356/375

[56] References Cited

U.S. PATENT DOCUMENTS

| | | | |
|---|---|---|---|
| 4,451,197 | 5/1984 | Lange | 414/737 |
| 4,453,082 | 6/1984 | Pryor | 250/559.4 |
| 4,747,198 | 5/1988 | Asai et al. | 29/407 |
| 5,628,110 | 5/1997 | Sakaguchi et al. | 356/375 |
| 5,742,048 | 4/1998 | Kobayashi et al. | 250/559.4 |
| 5,991,039 | 11/1999 | Fujishiro et al. | 356/375 |

*Primary Examiner*—Stephone B. Allen
*Attorney, Agent, or Firm*—Oblon, Spivak, McClelland, Maier & Neustadt, P.C.

[57] ABSTRACT

The present apparatus includes an attracting transport arm for attracting an attraction object via a nozzle hole by vacuum and transporting the attraction object in a horizontal or vertical direction. An upwardly directed light emitting sensor is disposed on the rear side of a portion of a stage at which the attraction object is to be placed. At the location at which the attraction object is to be placed, a through-hole which is intended to prevent interception upward rays of light of the light emitting element is perforated. Meanwhile, a downwardly directed light receiving element for receiving rays of light from the light emitting element is disposed in the interior of the nozzle hole of the attracting transport arm.

19 Claims, 3 Drawing Sheets

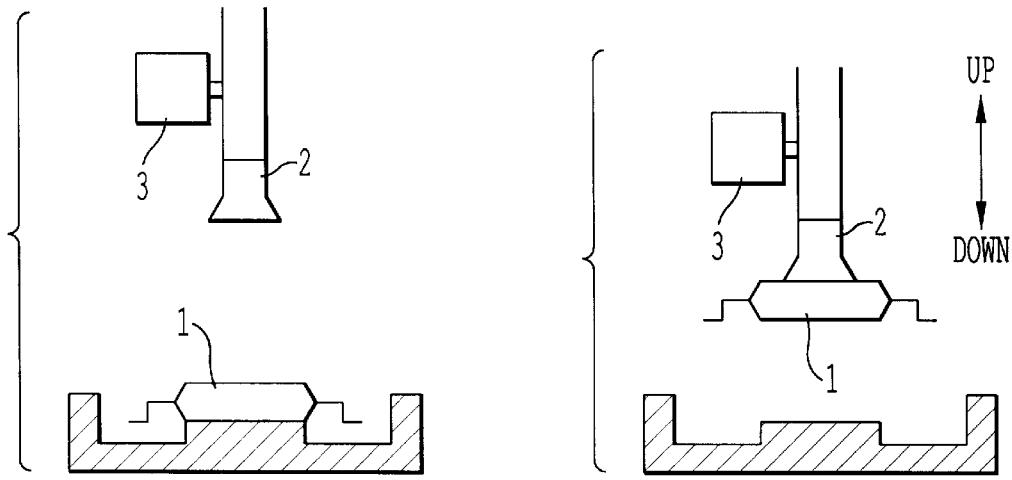
FIG. 1A
PRIOR ART
FIG. 1B
PRIOR ART
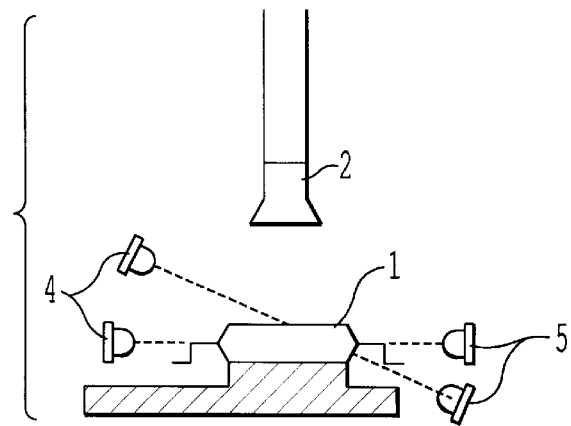
FIG. 2
PRIOR ART

SUCKED MATERIAL DETECTOR, SUCKED MATERIAL DETECTING METHOD USING THE SAME DETECTOR, SHIFT DETECTING METHOD USING THE SAME DETECTOR, AND CLEANING METHOD USING THE SAME DETECTOR

TECHNICAL FIELD

This invention relates to an attraction object detection apparatus and an attraction object detection method which can detect whether or not an attraction object is present, and more particularly to an attraction object detection apparatus and an attraction object detection method suitable for use with an IC test handler which has an attracting transport arm.

BACKGROUND ART

Conventionally, an attraction object to be transported by an attracting transport arm is detected using, for example, a pressure sensor or a transmission type sensor.

Therefore, an attraction object detection apparatus which employs a pressure sensor is shown in (a) and (b) of FIG. 1 while another attraction object detection apparatus which employs a transmission type sensor is shown in FIG. 2, and their constructions and operations are described.

The apparatus shown in FIG. 1 is constructed such that it includes an arm 2 having a suction opening and movable in a horizontal direction and a vertical direction and air around the suction opening of the arm 2 is sucked into a vacuum source (not shown) via a pressure sensor 3. In the present apparatus, whether or not an attraction object 1 is present is discriminated by a pressure sensor 3 when the arm 2 is moved down to a location at which the attraction object 1 is to be placed. In particular, if the attraction object 1 is not present when the arm 2 is moved down, since the suction opening of the arm 2 remains in a leaking condition, a drop of pressure is not detected by the pressure sensor 3, but if the attraction object 1 is present, then there is no leak from the arm 2 and a drop of pressure is detected by the pressure sensor 3. From this, whether or not the attraction object 1 is present can be discriminated.

Meanwhile, in the apparatus shown in FIG. 2, a transmission type sensor is disposed at a location at which an attraction object 1 is to be placed. In the transmission type sensor, rays of light which go across the location at which the attraction object 1 is to be placed are formed from a pair of light emitting elements 4 and a pair of light receiving elements 5. In the apparatus of the type just described, whether or not an attraction object 1 is present can be discriminated as the attraction object 1 intercepts rays of light between the pair of light emitting elements 4 and the pair light receiving elements 5 of the transmission type sensor.

However, such an apparatus as shown in FIG. 1 is disadvantageous in that whether or not an attraction object is present cannot be discriminated unless the arm is moved down to the location at which the attraction object is to be placed. The apparatus is disadvantageous also in that it may possibly discriminate in error that an attraction object is present because of an error in adjustment of the pressure sensor.

On the other hand, such an apparatus as shown in FIG. 2 is disadvantageous in that it cannot be used where the sensor cannot be mounted in horizontal and oblique directions with respect to an attraction object. The apparatus is disadvantageous also in that, where it is intended to discriminate whether or not an attraction object is present at each of a large number of attraction points, a large number of sensors are required.

DISCLOSURE OF INVENTION

It is an object of the present invention to provide an attraction object detection apparatus and method which is superior in throughput to the constructions of the prior art described above, can detect with certainty whether or not there is present an attraction object, and in which the required space is reduced and is simple in construction.

In order to attain the object described above, the present invention presupposes an attraction object detection apparatus for detecting whether or not an attraction object to be attracted and transported by an attracting transport arm which is movable in vertical and horizontal directions is present at a predetermined location of a stage. And, a first aspect of the present invention is characterized by the following points. In particular, the attracting transport arm has a nozzle hole formed therein in such a manner as to be opened toward the stage side and communicated with a vacuum source. A light emitting element is disposed either on the rear side to the predetermined location or on the attracting transport arm. The stage has a through-hole provided at the predetermined location such that rays of light from the light emitting element may not be intercepted by the stage. And, a light receiving element for receiving the rays of light from the light emitting element is disposed on the rear side to the predetermined location or the attracting transport arm at which the light emitting element is not disposed. Particularly, the light emitting element or the light receiving element is preferably disposed in the interior of the nozzle hole of the attracting transport arm.

Meanwhile, a second aspect of the present invention is characterized by the following features. In particular, a reflection element is disposed either on a surface of the stage at the predetermined location or on the attracting transport arm. And, a light emitting element and a light receiving element for receiving rays of light from the light emitting element via the reflection element are disposed on the surface at the predetermined location or the attracting transport arm at which the reflection element is not disposed. Particularly, either the light emitting element and the light receiving element in pair or the reflection element is preferably disposed in the interior of the nozzle hole of the attracting transport arm.

In those apparatus, an upper portion of the attracting transport arm including the light emitting element or the light receiving element or else the reflection element or a set of a light emitting element and a light receiving element disposed in the interior of the nozzle hole may form a sensor unit independent of but connectable to the attracting transport arm by an optical fiber. Or, the sensor unit independent of the attracting transport arm may be secured at a position opposing the predetermined location while the attracting transport arm is so structured as to allow rays of light from the light emitting element to pass thereto.

A third aspect of the present invention provides an attraction object detection method which uses the apparatus according to the first or second aspect of the present invention described above, characterized in that, when the attracting transport arm is moved to a position above the predetermined location, if the light receiving element receives no light, then it is determined that an attraction object is present, but if the light receiving element receives light, then it is discriminated that no attraction object is present.

In this method, preferably a vacuum pressure sensor is provided in a vacuum line from the nozzle hole of the attracting transport arm to the vacuum source, and after it is discriminated by the light receiving element that an attraction object is present, the attracting transport arm is moved downwardly to the predetermined location and performs an attraction operation to confirm presence or absence of the attraction object again by means of the vacuum pressure sensor.

A fourth aspect of the present invention provides a positional displacement detection method for detecting positional displacement of an attracting transport arm using an apparatus according to the first or second aspect of the present invention, characterized in that, when the attracting transport arm is moved from a reference position to a position above the predetermined location while an attraction object is not present at the predetermined location, if the light receiving element does not receive rays of light from the light emitting element, then it is determined that the position of the attracting transport arm is displaced from the predetermined position. In this instance, preferably, after it is determined that the position of the attracting transport arm is displaced from the predetermined location, the attracting transport arm is horizontally moved in an arbitrary direction until the light receiving element receives the rays of light from the light emitting element, and coordinates of the position to which the attracting transport arm is to be moved upwardly above the predetermined location are corrected based on coordinates of a position recognized by moving means for the attracting transport arm when the light receiving element receives the rays of light.

A fifth aspect of the present invention provides a cleaning method which uses an apparatus according to the first or second aspect of the present invention described above, characterized in that positive pressure air is supplied into a vacuum line from the nozzle hole of the attracting transport arm to the vacuum source to blow out the air from the nozzle hole toward the predetermined location.

A sixth aspect of the present invention provides an attraction object detection apparatus, characterized in that a proximity sensor is disposed at the predetermined location.

A seventh aspect of the present invention provides an attraction object detection apparatus, characterized in that distance detection means for measuring a distance to an object present in an opposing direction is disposed on the attracting transport arm. And, an attraction object detection method according to this apparatus is characterized in that presence or absence of the attraction object is determined from the fact that the distance detected by the distance detection means is different whether the object is the attraction object or the stage, and also a distance of downward movement of the attracting transport arm is recognized by the distance detection means.

BRIEF DESCRIPTION OF DRAWINGS (a) and (b) of FIG. 1 are schematic views showing an example of a conventional attraction object detection apparatus which employs a pressure sensor;

FIG. 2 is a schematic view showing an example of a conventional attraction object detection apparatus which employs a transmission type sensor;

BEST MODE FOR CARRYING OUT THE INVENTION

Next, embodiments of the present invention are described below with reference to the drawings.

Figure 3:
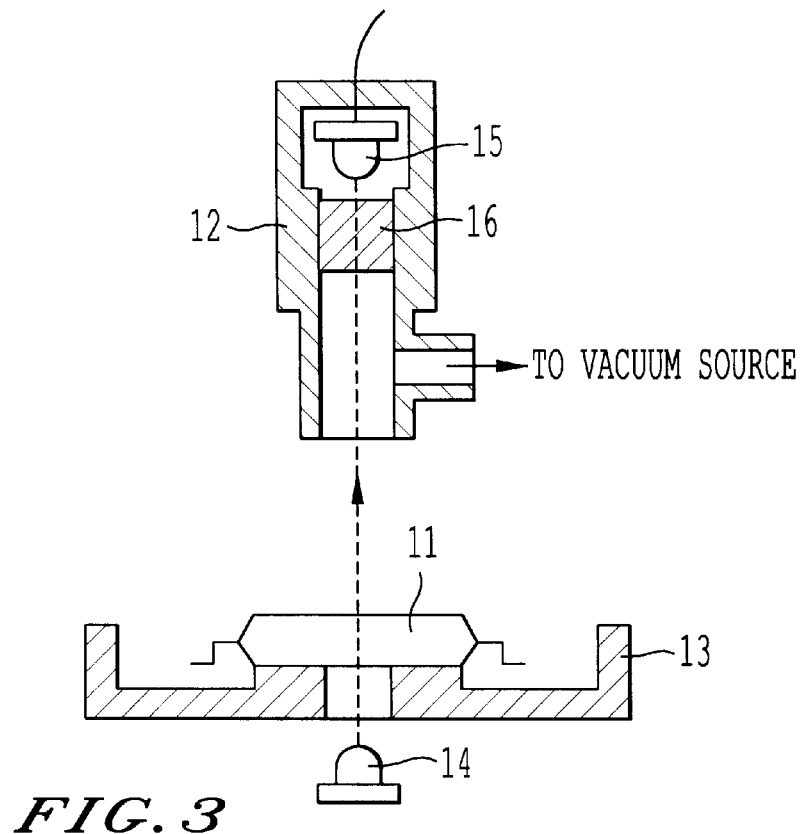
FIG. 3 is a schematic sectional view showing an embodiment of an attraction object detection apparatus and method of the present invention.

FIG. 3 is a schematic sectional view showing an embodiment of an attraction object detection apparatus and method of the present invention. The apparatus of the embodiment shown includes an attracting transport arm 12 for attracting and transporting an attraction object 11 in horizontal and vertical directions. More particularly, the attracting transport arm 12 has a nozzle hole opened downwardly. An outlet port for extracting air from the nozzle hole to a vacuum source (not shown) is disposed at a side portion of the arm 12. Consequently, when the vacuum source operates, the attraction object 11 can be attracted to the opening end of the nozzle hole.

The attraction object 11 is scheduled to be placed on a stage 13, and an upwardly directed light emitting sensor 14 is disposed on the rear side of the location of the stage 13 at which the attraction object 11 is to be placed. At the location of the stage 13 at which the attraction object 11 is to be placed, a through-hole is opened so that it does not interrupt upward rays of light from the light emitting sensor 14. Meanwhile, a downwardly directed light receiving sensor 15 for receiving rays of light from the light emitting sensor 14 is disposed in the interior of the nozzle hole of the attracting transport arm 12. The light receiving sensor 15 and the light emitting sensor 14 in pair construct a so-called transmission type sensor. It is to be noted that the light receiving sensor 15 in the attraction nozzle hole may be covered with a transport element 16. Further, the light emitting sensor 14 may be disposed on the attracting transport arm side while the light receiving sensor 15 is disposed on the stage side. Or, the light emitting sensor 14 or the light receiving sensor 15 may be mounted on an outer side of the attracting transport arm 12.

In the apparatus of the form described, the attracting transport arm 12 is first moved to a location above the location of the stage 13 at which the attraction object 11 is to be placed. In this instance, if the attraction object 11 is present on the stage 13, then the attraction object 11 intercepts upward rays of light from the light emitting sensor 14. Consequently, the light receiving sensor 15 in the attracting transport arm 12 does not react. From this, it can be discriminated that an attraction object is present. Therefore, the attracting transport arm 12 is moved downwardly, attracts the attraction object 11 thereto and is then moved upwardly as in an ordinary operation. On the other hand, if the attraction object 11 is not on the stage 13, then the rays of light from the light emitting sensor 14 on the rear side of the stage 13 come to the light receiving sensor 15 in the attracting transport arm 12, and consequently, the light receiving sensor 15 reacts. From this, it can be discriminated that no attraction object is present, and also the moved position of the arm is confirmed. Further, in the apparatus of the construction just described, even if downward movement of the attracting transport arm 12 is not performed, whether or not there is present an attraction object can be confirmed. Accordingly, since no useless downward or upward movement is involved, the apparatus is improved in throughput comparing with the prior art shown in FIG. 1.

Further, in the present embodiment, if air of a positive pressure is supplied to a vacuum line extending from the nozzle hole to the vacuum source, then the air can be blown from the nozzle hole to the upper surface of the light emitting sensor 14 on the rear side of the stage 13, to which dust or like foreign articles are liable to stick, to clean the sensor readily.

However, in the present embodiment, since it is discriminated that an attraction object is present when the light receiving sensor 15 does not receive rays of light from the light emitting sensor 14, if the stopping position of the arm 12 is displaced from the light emitting sensor 14, the sensor may discriminate in error that an attraction object is present although the attraction object 11 is not present on the stage 13. In this instance, if such a pressure sensor as shown in FIG. 1 is provided for the vacuum line from the nozzle hole to the vacuum source, such positional displacement of the arm as described above can be discriminated by the pressure sensor. In particular, the positional displacement of the arm can be discriminated if it is discriminated again by means of the pressure sensor whether or not the attraction object 11 is present after the attracting transport arm 12 is moved downwardly to perform an attracting operation.

Further, even if a pressure sensor is not used but another sensor or a like element which can detect a thickness of an attraction object or a distance to an attraction object is used, it is possible to confirm whether or not there is present an attraction object and positional displacement of the arm.

The present invention is not limited to the form described above and may have such various forms as described below. FIGS. 4 to 7 are schematic sectional views of other embodiments of the attraction object detection apparatus and method of the present invention. In the description of the other embodiments and the drawings, the same components as those of the embodiment described above are denoted by the same reference numerals and overlapping description is omitted.

Figure 4:
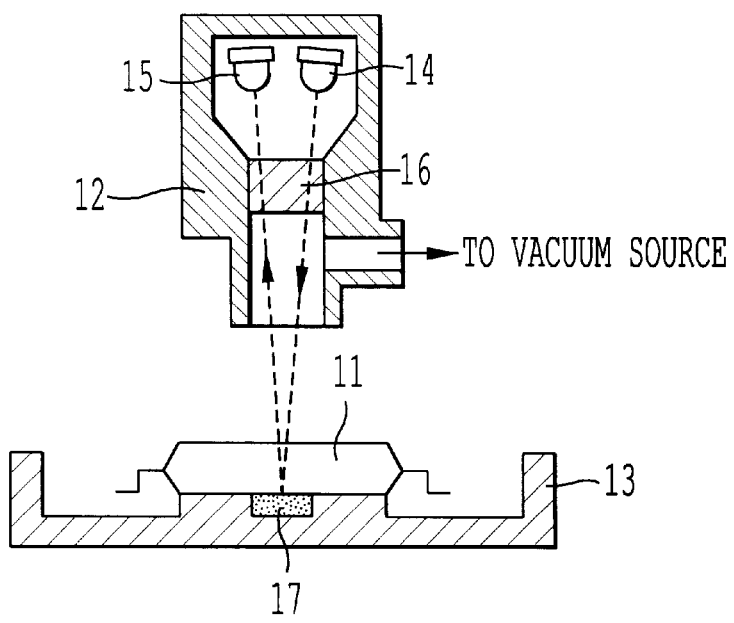
FIG. 4 is a schematic sectional view showing another embodiment of an attraction object detection apparatus and method of the present invention.

In the apparatus of the form shown in FIG. 4, a reflection element 17 is disposed on the surface of the location of the stage 13 at which the attraction object 11 is to be placed. Further, a reflection type sensor formed from a light emitting sensor 14 and a light receiving sensor 15 in pair is disposed in the interior of the nozzle hole of the attracting transport arm 12. It is to be noted that the reflection type sensor in the nozzle hole may be covered with a transport element 16. Further, the light emitting sensor 14 and the light receiving sensor 15 in pair may be disposed on the stage side while the reflection 17 element is disposed on the attracting transport arm side. Or, either the light emitting sensor 14 and the light receiving sensor 15 in pair or the reflection 17 may be mounted on an outer side of the attracting transport arm 12.

Also in the apparatus of the present form, the attracting transport arm 12 is first moved to a location above the location of the stage 13 at which the attraction object 11 is to be placed. In this instance, when the attraction object 11 is present on the stage 13, the reflection element 17 is covered with the attraction object 11. Consequently, the light receiving sensor 15 in the attracting transport arm 12 does not react. Since it can be discriminated from this that an attraction object is present, the attracting transport arm 12 is moved downwardly, attracts the attraction object 11 and is then moved upwardly as in an ordinary operation. On the other hand, when the attraction object 11 is not present on the stage 13, rays of light from the light emitting sensor 14 are reflected by the reflection element 17 and come to the light receiving sensor 15, and consequently, the light receiving sensor 15 reacts. From this, it can be discriminated that no attraction object is present and also the moved position of the arm can be confirmed. Further, in the apparatus just described, since no useless downward or upward movement is involved, the apparatus is improved in throughput comparing with the prior art shown in FIG. 1, similarly as in the form described above.

Further, also in the present form, if air of a positive pressure is supplied to a vacuum line extending from the nozzle hole to the vacuum source, then the air can be blown from the attraction nozzle to the upper surface of the reflection element 17 on the stage 13 to clean the sensor readily.

However, also in the present form, since it is discriminated that an attraction object is present when the light receiving sensor 15 does not receive reflected rays of light of the light emitting sensor 14 from the reflection element 17, if the stopping position of the arm 12 is displaced from the light emitting sensor 14, the sensor may discriminate in error that an attraction object is present although the attraction object 11 is not present on the stage 13. In this instance, if such a pressure sensor as shown in FIG. 1 is provided for the vacuum line from the nozzle hole to the vacuum source, such positional displacement of the arm as described above can be discriminated by the pressure sensor. In particular, the positional displacement of the arm can be discriminated if it is discriminated again by means of the pressure sensor whether or not the attraction object 11 is present after the attracting transport arm 12 is moved downwardly to perform an attracting operation.

Further, even if a pressure sensor is not used but another sensor or a like element which can detect a thickness of an attraction object or a distance to an attraction object is used, it is possible to confirm whether or not there is present an attraction object and positional displacement of the arm similarly as in the form described above.

Figure 5:
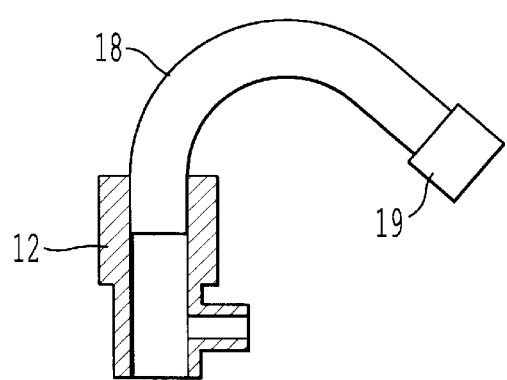
FIG. 5 is a schematic sectional view showing a further embodiment of an attraction object detection apparatus and method of the present invention.

In addition to the two forms described above, the present invention may be an apparatus wherein an upper portion of the attracting transport arm 12 shown in FIG. 3 or 4, that is, the sensor arrangement in the interior of the nozzle hole (where a transmission type sensor is used, only the light receiving sensor, but where a reflection type sensor is used, a set of light emitting and light receiving sensors), is formed as a sensor unit 19 independent of the attracting transport arm 12 as shown in FIG. 5, and the sensor unit 19 and the nozzle hole of the attracting transport arm 12 are connected to each other by an optical fiber 18.

Figure 6:
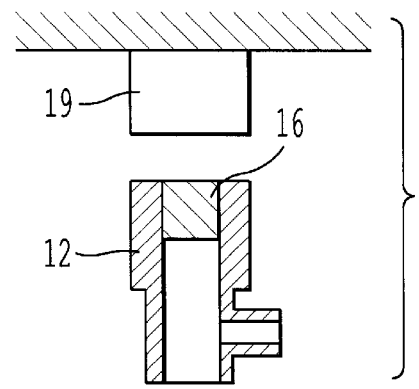
FIG. 6 is a schematic sectional view showing a still further embodiment of an attraction object detection apparatus and method of the present invention.

Or, the present invention may be an apparatus wherein, as shown in FIG. 6, such a sensor unit 19 as described above is fixed in an opposing relationship to the light emitting sensor 14 on the rear face of the stage 13 shown in FIG. 3 or to the reflection element 17 on the stage 13 shown in FIG. 4. It is to be noted that, in this instance, the interior of the nozzle hole extends through up to the upper end of the attracting transport arm 12 so that rays of light of the sensor may pass in the attracting transport arm 12, and is covered with a transport element 16.

Figure 7:
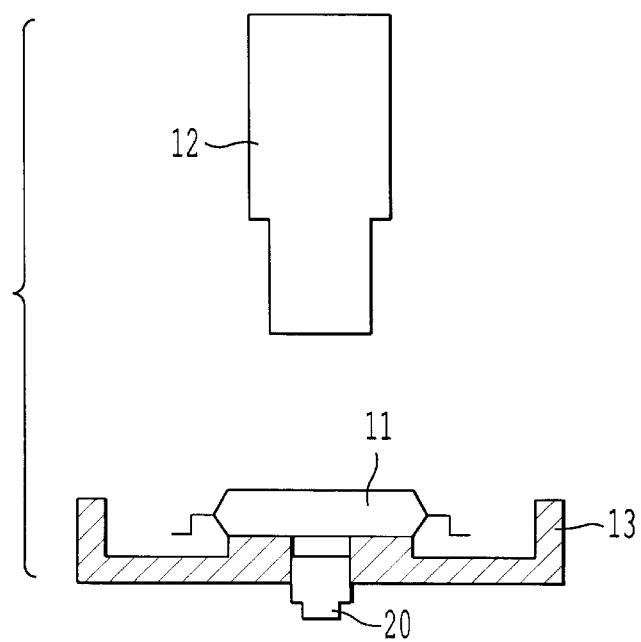
FIG. 7 is a schematic sectional view showing a yet further embodiment of an attraction object detection apparatus and method of the present invention.

Further, the apparatus which includes such a transmission type sensor as shown in FIG. 3 or such a reflection type sensor as shown in FIG. 4 may be replaced by a yet further apparatus wherein a proximity sensor 20 is installed at the location of the stage 13 at which the attraction object 11 is to be placed as shown in FIG. 7.

Besides, where the distance detection means for measuring the distance to the object present in the opposing direction is disposed on the attracting transport arm, the distance of downward movement of the attracting transport art to the attraction object can be recognized by itself. Consequently, if, for example, a servomotor is used for a vertically moving the apparatus for the attracting transport arm, so that even if the height of the attraction object changes, the downward stroke of the attracting transport arm when the attraction object is to be attracted can be adjusted readily based on the recognized distance of downward movement. This is effective in maintenance comparing with that where the vertically moving apparatus for the attracting transport arm employs an air cylinder. In particular, where the vertically moving apparatus employs an air cylinder, if the height of the attraction object changes, then time and labor are required for adjustment such that the mounted position of the air cylinder is adjusted or the height of the attraction object on the stage is adjusted.

Further, when the attracting transport arm is horizontally moved from a reference position to a position above the predetermined location, the stopping position of the arm is sometimes displaced from the predetermined location. This arises from the following cause. Generally, coordinates of the position of the predetermined location are determined as an origin in advance. Then, a moving apparatus for the attracting transport arm refers to the coordinates of the position of the predetermined location to calculate a movement amount and moves the attracting transport arm by the movement amount from the reference position. However, as transportation is repeated for a long time, the transport apparatus deteriorates, resulting in displacement of the reference position. In this instance, even if the attracting transport arm is moved from the reference position by the movement amount calculated referring to the coordinates of the position of the predetermined location, the stopping position of the arm is displaced from the predetermined location. As a result, the attracting transport arm fails to attract an attraction object present at the predetermined location, or even if it successfully attracts the attraction object, it fails to transport the attraction object accurately to a next transport location.

According to the present invention, also such positional displacement of the arm can be detected. In particular, in a condition wherein an attraction object is not present at the predetermined location, the attracting transport arm is horizontally moved from the reference position to the position above the predetermined location. In this instance, if rays of light from the light emitting sensor are not received by the light receiving sensor, it can be discriminated that the position of the attracting transport arm is displaced from the predetermined location. Further, after it is discriminated that the stopping position of the attracting transport arm is displaced in this manner, the attracting transport arm is horizontally moved in an arbitrary direction until the rays of light from the light emitting sensor are received by the light receiving sensor. Then, the coordinates of the position when the attracting transport arm is to be moved to the position above the predetermined location are corrected based on the coordinates of the position recognized by the moving apparatus for the attracting transport arm when the light receiving sensor receives the light. Consequently, the positional displacement of the attracting transport arm from the predetermined location is corrected, and the attraction object present at the predetermined location can be transported accurately to a next transport position. Besides, since the positional displacement detection element is provided in the nozzle of the attracting transport arm, the apparatus is very small in size comparing with an alternative apparatus wherein the positional displacement is detected using, for example, a camera.

As described above, according to the present invention, a light emitting element is disposed either on the rear side of a stage at a predetermined location or on an attracting transport arm. The stage has a through-hole provided at the predetermined location such that rays of light from the light emitting element may not be intercepted by the stage. And, a light receiving element for receiving the rays of light from the light emitting element is disposed on the rear side to the predetermined location or the attracting transport arm at which the light emitting element is not disposed. On the other hand, a reflection element is disposed either on a surface of a stage at the predetermined location or on an attracting transport arm. And, a light emitting element and a light receiving element for receiving rays of light from the light emitting element via the reflection element are disposed on the surface at the predetermined location or the attracting transport arm at which the reflection element is not disposed. By this arrangement, since useless upward and downward movements as in the prior art which only employs a pressure sensor need not be performed in discrimination of whether or not an attraction object is present, the apparatus of the present invention is improved in throughput. Further, since an attraction object can be detected in a vertical direction, a large space in a horizontal plane is not required for installation of a sensor, and also the number of sensors can be reduced comparing with the prior art.

Further, in such an apparatus as described above, also positional displacement of the attracting transport arm can be confirmed. Further, if the apparatus is combined with the prior art which employs a pressure sensor, then whether or not an attraction object is present can be detected with a higher degree of accuracy. Furthermore, by supplying air of a positive pressure to a vacuum line of the attracting transport arm and blowing out the air from the attraction nozzle, it is possible to clean the light emitting sensor or the reflection element disposed at the predetermined position.

What is claimed is:

1. An attraction object detection apparatus for detecting whether an attraction object (11) to be attracted and transported by an attracting transport arm (12) which is movable in vertical and horizontal directions is present at a predetermined location of a stage (13), wherein:

said attracting transport arm (12) has a nozzle hole formed therein in such a manner as to be opened toward said stage (13) side and communicated with a vacuum source;

a light emitting element (14) is disposed either on the rear side to said predetermined location or in the interior of said nozzle hole of said attracting transport arm (12);

said stage has a through-hole provided at said predetermined location such that rays of light from said light emitting element (14) may not be intercepted by said stage;

a light receiving element (15) for receiving the rays of light from said light emitting element (14) is disposed on the rear side to said predetermined location or in the interior of said nozzle hole of said attracting transport arm (12) at which said light emitting element (14) is not disposed; and an upper portion of said attracting transport arm (12) including said light emitting element (14) or said light receiving element (15) disposed in the interior of said nozzle hole forms a sensor unit (19) independent of but connectable to said attracting transport arm (12) by an optical fiber (18).

2. An attraction object detection apparatus as set forth in claim 1, wherein said sensor unit(19) is secured at a position opposing to said predetermined location while said attracting transport arm(12) is so structured as to allow rays of light from said light emitting element(14) to pass thereto.

3. A cleaning method which uses an apparatus as set forth in claim 1, wherein positive pressure air is supplied into a vacuum line from said nozzle hole of said attracting transport arm(12) to said vacuum source to blow out the air from said nozzle hole toward said predetermined location.

4. An attraction object detection method which uses an apparatus as set forth in claim 1, wherein, when said attracting transport arm(12) is moved to a position above said predetermined location, if said light receiving element (15) receives no light, then it is determined that an attraction object is present, but if said light receiving element(15) receives light, then it is determined that no attraction object is present.

5. An attraction object detection method as set forth in claim 4, wherein a vacuum pressure sensor is provided in a vacuum line from said nozzle hole of said attracting transport arm(12) to said vacuum source, and after it is determined by said light receiving element(15) that an attraction object is present, said attracting transport arm(12) is moved downwardly to said predetermined location and performs an attraction operation to confirm presence or absence of the attraction object again by said vacuum pressure sensor.

6. A positional displacement detection method for detecting positional displacement of an attracting transport arm (12) using an attraction object detection apparatus for detecting whether an attraction object (11) to be attracted and transported by an attracting transport arm (12) which is movable in vertical and horizontal directions is present at a predetermined location of a stage (13), wherein:

said attracting transport arm (12) has a nozzle hole formed therein in such a manner as to be opened toward said stage (13) side and communicated with a vacuum source;

a light emitting element (14) is disposed either on the rear side to said predetermined location or in the interior of said nozzle hole of said attracting transport arm (12);

said stage has a through-hole provided at said predetermined location such that rays of light from said light emitting element (14) may not be intercepted by said stage;

a light receiving element (15) for receiving the rays of light from said light emitting element (14) is disposed on the rear side to said predetermined location or in the interior of said nozzle hole of said attracting transport arm (12) at which said light emitting element (14) is not disposed; and when said attracting transport arm (12) is moved from a reference position to a position above said predetermined location while an attraction object (11) is not present at said predetermined location, if said light receiving element (15) does not receive rays of light from said light emitting element (14), then it is determined that the position of said attracting transport arm (12) is displaced from said predetermined position.

7. A positional displacement detection method as set forth in claim 6, wherein, after it is determined that the position of said attracting transport arm(12) is displaced from said predetermined location, said attracting transport arm(12) is horizontally moved in an arbitrary direction until said light receiving element(15) receives the rays of light from said light emitting element(14), and coordinates of the position to which said attracting transport arm is to be moved upwardly above said predetermined location are corrected based on coordinates of a position recognized by moving means for said attracting transport arm(12) when said light receiving element(15) receives the rays of light.

8. An attraction object detection apparatus for detecting whether or not an attraction object(11) to be attracted and transported by an attracting transport arm(12) which is movable in vertical and horizontal directions is present at a predetermined location of a stage(13), wherein:

said attracting transport arm(12) has a nozzle hole formed therein in such a manner as to be opened toward said stage(13) side and communicated with a vacuum source;

a reflection element(17) is disposed either on a surface of said stage at said predetermined location or on said attracting transport arm(12); and a light emitting element(15) and a light receiving element (15) for receiving rays of light from said light emitting element(14) via said reflection element(17) are disposed on the surface at said predetermined location or said attracting transport arm(12) at which said reflection element(17) is not disposed.

9. An attraction object detection apparatus for detecting whether or not an attraction object(11) to be attracted and transported by an attracting transport arm(12) which is movable in vertical and horizontal directions is present at a predetermined location of a stage(13), wherein:

said attracting transport arm(12) has a nozzle hole formed therein in such a manner as to be opened toward said stage(13) side and communicated with a vacuum source;

a reflection element(17) is disposed either on a surface of said stage at said predetermined location or in the interior of said nozzle hole of said attracting transport arm(12); and a light emitting element(14) and a light receiving element (15) for receiving rays of light from said light emitting element(14) via said reflection element(17) are disposed on the surface at said predetermined location or in the interior of said nozzle hole of said attracting transport arm(12) at which said reflection element(17) is not disposed.

10. An attraction object detection apparatus as set forth in claim 9, wherein an upper portion of said attracting transport arm(12) including said reflection element(17) or a set of light emitting element(14) and a light receiving element(15) disposed in the interior of said nozzle hole forms a sensor unit(19) independent of but connectable to said attracting transport arm(12) by an optical fiber(18).

11. An attraction object detection apparatus as set forth in claim 9, wherein an upper portion of said attracting transport arm(12) including said reflection element(17) or a set of light emitting element(14) and a light receiving element(15) disposed in the interior of said nozzle hole forms a sensor unit(19) independent of said attracting transport arm(12), and said sensor unit(19) is secured at a position opposing to said predetermined location, while said attracting transport arm(12) is so structured as to allow rays of light from said light emitting element(14) to pass thereto.

12. A cleaning method which uses an apparatus as set forth in claim 9, wherein positive pressure air is supplied into a vacuum line from said nozzle hole of said attracting transport arm(12) to said vacuum source to blow out the air from said nozzle hole toward said predetermined location.

13. An attraction object detection method which uses an apparatus as set forth in claim 9, wherein, when said attracting transport arm(12) is moved to a position above said predetermined location, if said light receiving element (15) receives no light, then it is discriminated that an attraction object is present, but if said light receiving element(15) receives light, then it is discriminated that no attraction object is present.

14. An attraction object detection method as set forth in claim 13, wherein a vacuum pressure sensor is provided in a vacuum line from said nozzle hole of said attracting transport arm(12) to said vacuum source, and after it is discriminated by said light receiving element(15) that an attraction object is present, said attracting transport arm(12) is moved downwardly to said predetermined location and performs an attraction operation to confirm presence or absence of the attraction object again by means of said vacuum pressure sensor.

15. A positional displacement detection method for detecting positional displacement of an attracting transport arm(12) using an apparatus as set forth in claim 9, wherein, when said attracting transport arm(12) is moved from a reference position to a position above said predetermined location while an attraction object(11) is not present at said predetermined location, if said light receiving element(15) does not receive rays of light from said light emitting element(14), then it is discriminated that the position of said attracting transport arm(12) is displaced from said predetermined position.

16. A positional displacement detection method as set forth in claim 15, wherein, after it is discriminated that the position of said attracting transport arm(12) is displaced from said predetermined location, said attracting transport arm(12) is horizontally moved in an arbitrary direction until said light receiving element(15) receives the rays of light from said light emitting element(14), and coordinates of the position to which said attracting transport arm is to be moved upwardly above said predetermined location are corrected based on coordinates of a position recognized by moving means for said attracting transport arm(12) when said light receiving element(15) receives the rays of light.

17. An attraction object detection apparatus for detecting whether or not an attraction object(11) to be attracted and transported by an attracting transport arm(12) which is movable in vertical and horizontal directions is present at a predetermined location of a stage(13), wherein a proximity sensor(20) is disposed at said predetermined location.

18. An attraction object detection apparatus for detecting whether or not an attraction object(11) to be attracted and transported by an attracting transport arm(12) which is movable in vertical and horizontal directions is present at a predetermined location of a stage(13), wherein said attracting transport arm(12) has a nozzle hole formed therein in such a manner as to be opened toward said stage(13) side and communicated with a vacuum source, and distance detection means for measuring a distance to an object present in an opposing direction is disposed on said attracting transport arm(12).

19. An attraction object detection method which uses an apparatus as set forth in claim 18, wherein presence or absence of the attraction object(11) is discriminated from the fact that the distance detected by said distance detection means is different whether the object is the attraction object (12) or said stage(13), and also a distance of downward movement of said attracting transport arm(12) is recognized by said distance detection means.

* * * * *

UNITED STATES PATENT AND TRADEMARK OFFICE
CERTIFICATE OF CORRECTION

| | |
|---|---|
| PATENT NO. | : 6,153,887 |
| DATED | : November 28, 2000 |
| INVENTOR(S) | : Katsunobu Furuta |

It is certified that error appears in the above-identified patent and that said Letters Patent is hereby corrected as shown below:

<u>Title page,</u>
Item [87] the PCT Publication Date is incorrect, item [87] should read as follows:

-- [87] PCT Pub. No.: WO97/46071
      PCT Pub. Date: December 4, 1997 --

Signed and Sealed this

Twenty-fifth Day of September, 2001

Attest:

*Nicholas P. Godici*

NICHOLAS P. GODICI
*Attesting Officer*    *Acting Director of the United States Patent and Trademark Office*